(12) United States Patent
Chang

(10) Patent No.: US 9,685,428 B2
(45) Date of Patent: Jun. 20, 2017

(54) DISPLAY DEVICE AND LIGHT-EMITTING ARRAY MODULE THEREOF

(71) Applicant: HARVATEK CORPORATION, Hsinchu (TW)

(72) Inventor: Jen-Hung Chang, Hsinchu County (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 15/054,542

(22) Filed: Feb. 26, 2016

(65) Prior Publication Data

US 2017/0040299 A1    Feb. 9, 2017

(30) Foreign Application Priority Data

Aug. 5, 2015 (TW) .............................. 104212614 U

(51) Int. Cl.

| | |
|---|---|
| H01L 25/075 | (2006.01) |
| H01L 33/54 | (2010.01) |
| H01L 33/62 | (2010.01) |
| H01L 25/16 | (2006.01) |

(52) U.S. Cl.
CPC .......... *H01L 25/0753* (2013.01); *H01L 33/54* (2013.01); *H01L 33/62* (2013.01); *H01L 2224/49113* (2013.01)

(58) Field of Classification Search
CPC ... H01L 25/0753; H01L 25/167; H01L 33/54; H01L 33/62
USPC .................................. 257/89; 345/83; 438/28
See application file for complete search history.

(56) References Cited

U.S. PATENT DOCUMENTS

| | | | |
|---|---|---|---|
| 2008/0160658 A1* | 7/2008 | Wang ..................... | H01L 21/561 438/28 |
| 2010/0258830 A1* | 10/2010 | Ide .......................... | H01L 33/60 257/98 |
| 2011/0020967 A1* | 1/2011 | Wang ...................... | F21K 9/00 438/27 |
| 2011/0050071 A1* | 3/2011 | Chung .................... | F21K 9/00 313/46 |
| 2012/0262434 A1* | 10/2012 | Nagashima ........... | G09G 3/3426 345/207 |

(Continued)

*Primary Examiner* — Cuong Q Nguyen
*Assistant Examiner* — Tong-Ho Kim
(74) *Attorney, Agent, or Firm* — Li & Cai Intellectual Property (USA) Office

(57) ABSTRACT

A light-emitting array module includes a circuit substrate, a light-emitting unit, and an encapsulation body. The light-emitting unit includes a plurality of light-emitting groups arranged in matrix on the circuit substrate. The encapsulation body disposed on the circuit substrate for encapsulating the light-emitting groups. The encapsulation body includes a plurality of encapsulation portions and a plurality of thin connection portions. Therefore, light beams generated by the light-emitting group is transformed into an obvious single point light source without halation due to the design of "each thin connection portion connected between the two adjacent encapsulation portions to separate the two adjacent encapsulation portions from each other by a predetermined distance", so that the color resolution of the light-emitting array module is increased. In addition, the present disclosure further provides a display device including the light-emitting array module.

19 Claims, 12 Drawing Sheets

(56) References Cited

U.S. PATENT DOCUMENTS

| | | | |
|---|---|---|---|
| 2013/0044501 A1* | 2/2013 | Rudisill | F21V 29/70 362/398 |
| 2013/0207566 A1* | 8/2013 | Sawada | H05B 33/0833 315/228 |
| 2014/0103385 A1* | 4/2014 | Hatano | H01L 51/5044 257/99 |

* cited by examiner

DISPLAY DEVICE AND LIGHT-EMITTING ARRAY MODULE THEREOF

BACKGROUND OF THE INVENTION

1. Field of the Invention

The present disclosure relates to a display device and a light-emitting module thereof, and more particularly to a display device and a light-emitting array module thereof.

2. Description of Related Art

In recent years, LEDs (light-emitting diodes) have been used widely due to good light-emitting quality and high light-emitting efficiency. LEDs have been developed capable of emitting red, green, and blue light, and LEDs have been increasingly used for various applications such as a full-color LED display, so that color performance of the full-color LED display can be increased. Typically, the red, green, and blue lights respectively generated by the red, green, and blue LEDs mixed to form colored light with high brightness and contrast, so as to display some information for viewer. The full-color LED display should have wider application and development.

However, light beams generated by each LED group having three LEDs cannot be transformed into an obvious single point light source due to an unseparated overall encapsulation layer or an unseparated strip-shaped encapsulation layer, so that halation is shown obviously between two adjacent LED groups and the color resolution of the LED display is decreased.

SUMMARY OF THE INVENTION

One aspect of the present disclosure relates to a display device and a light-emitting array module thereof.

One of the embodiments of the present disclosure provides a light-emitting array module, including a circuit substrate, a light-emitting unit, and an encapsulation body. The light-emitting unit includes a plurality of light-emitting groups arranged in matrix on the circuit substrate. The encapsulation body is disposed on the circuit substrate for encapsulating the light-emitting groups. In addition, the encapsulation body includes a plurality of encapsulation portions and a plurality of thin connection portions, the light-emitting groups are respectively enclosed by the encapsulation portions, each thin connection portion is connected between the two adjacent encapsulation portions, and a thickness of the thin connection portion relative to the circuit substrate is smaller than a thickness of the encapsulation portion relative to the circuit substrate.

Another one of the embodiments of the present disclosure provides a display device including a light-emitting array module, wherein the light-emitting array module includes a circuit substrate, a light-emitting unit, and an encapsulation body. The light-emitting unit includes a plurality of light-emitting groups arranged in matrix on the circuit substrate, and the light-emitting groups are respectively defined as a plurality of pixels for the display device. The encapsulation body is disposed on the circuit substrate for encapsulating the light-emitting groups. In addition, the encapsulation body includes a plurality of encapsulation portions and a plurality of thin connection portions, the light-emitting groups are respectively enclosed by the encapsulation portions, each thin connection portion is connected between the two adjacent encapsulation portions, and a thickness of the thin connection portion relative to the circuit substrate is smaller than a thickness of the encapsulation portion relative to the circuit substrate.

More particularly, in one of the practicable embodiments, each encapsulation portion has a surrounding cutting face formed on an outer perimeter surface thereof, each thin connection portion has a top cutting face formed on a top side thereof and connected between the two adjacent surrounding cutting faces of the two adjacent encapsulation portions, and a curved chamfer is formed on a connection location between the surrounding cutting face and the top cutting face.

More particularly, in another one of the practicable embodiments, each encapsulation portion has two lateral cutting faces opposite to each other and two lateral non-cutting faces opposite to each other and connected between the two lateral cutting faces, each thin connection portion has a top cutting face formed on a top side thereof and connected between the two adjacent lateral cutting faces of the two adjacent encapsulation portions, and a curved chamfer is formed between the lateral cutting face and the top cutting face.

Therefore, light beams generated by the light-emitting group can be transformed into an obvious single point light source without halation due to the design of "each thin connection portion being connected between the two adjacent encapsulation portions in order to separate the two adjacent encapsulation portions from each other by a predetermined distance", so that the color resolution of the light-emitting array module is increased. In addition, the light beams generated by the light-emitting group pass through the corresponding encapsulation portion to form a projection light source, and the light-emitting angle of the projection light source is increased.

To further understand the techniques, means and effects of the present disclosure applied for achieving the prescribed objectives, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

DETAILED DESCRIPTION OF THE PREFERRED EMBODIMENTS

The embodiments of "a display device and a light-emitting array module thereof" of the present disclosure are described. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

[First Embodiment]

Figure 1:
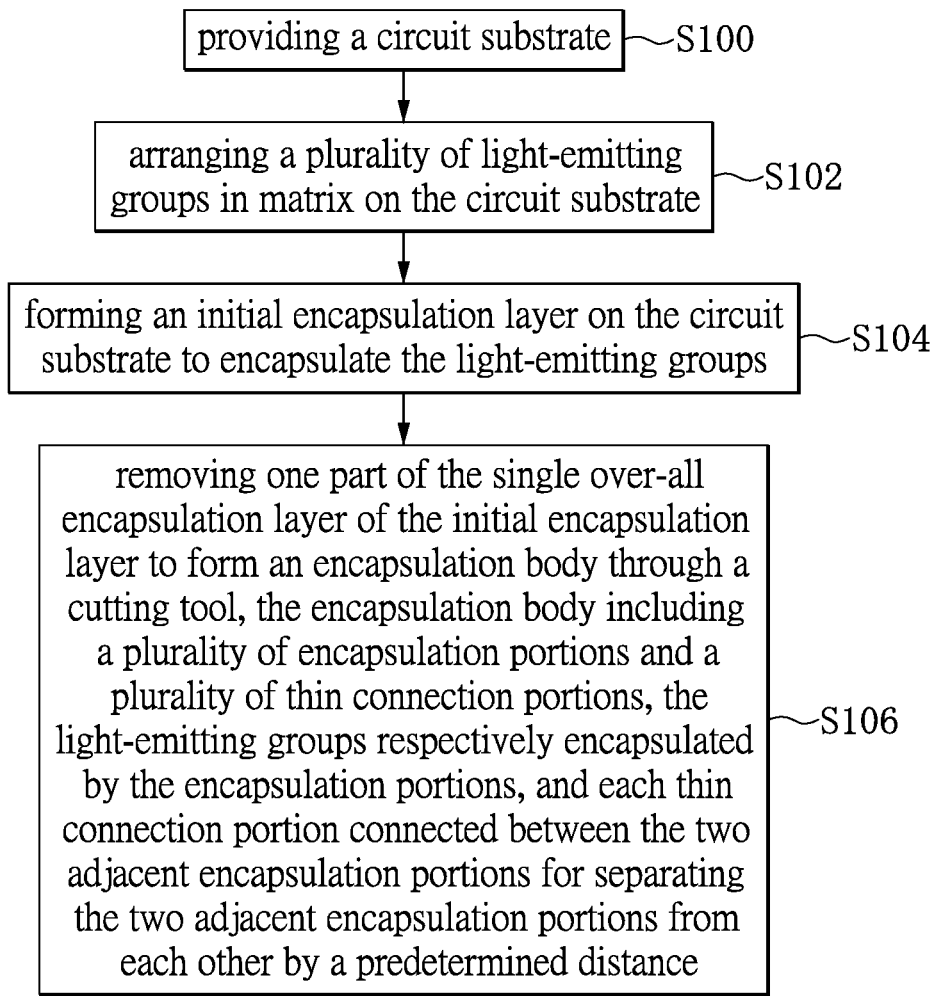
FIG. 1 shows a flowchart of the method of manufacturing a light-emitting array module according to the first embodiment of the present disclosure.
Figure 2:
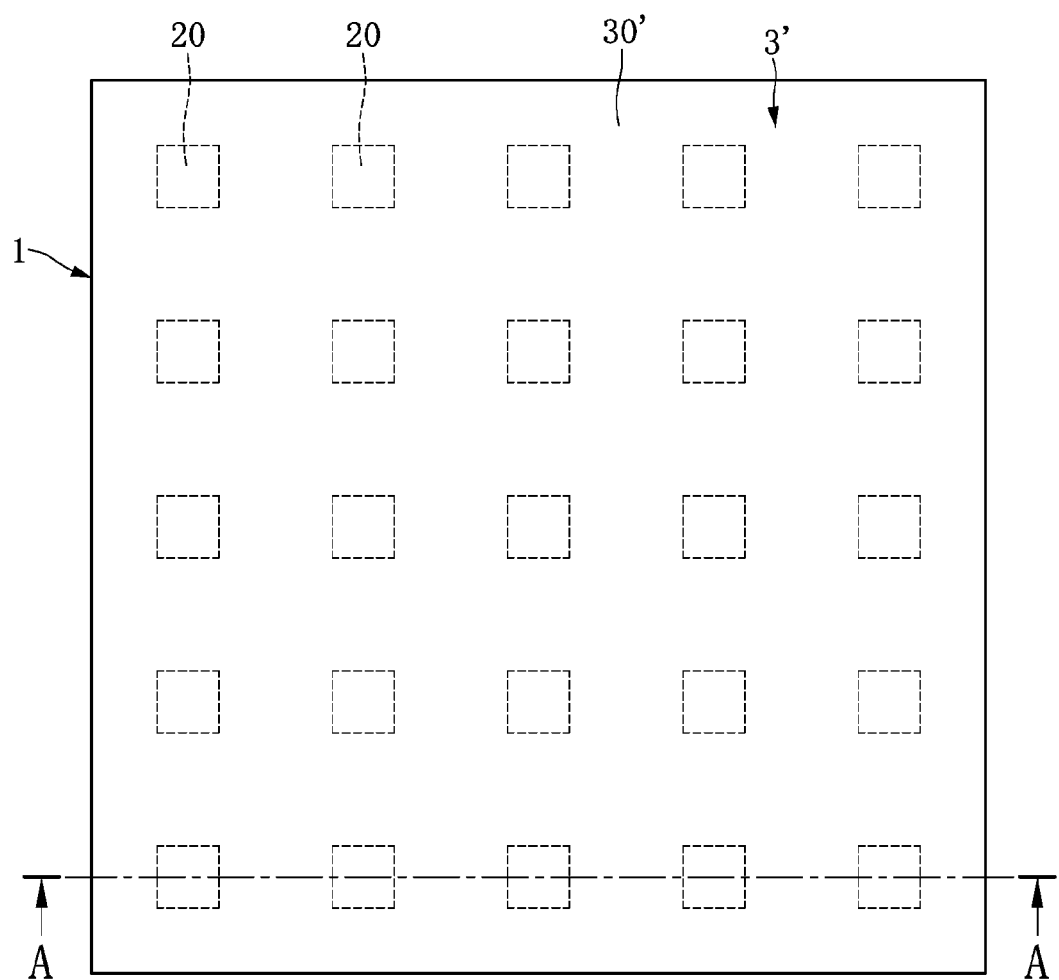
FIG. 2 shows a schematic view of a single over-all encapsulation layer of the light-emitting array module having not been cut by a cutting tool yet according to the first embodiment of the present disclosure.
Figure 3:
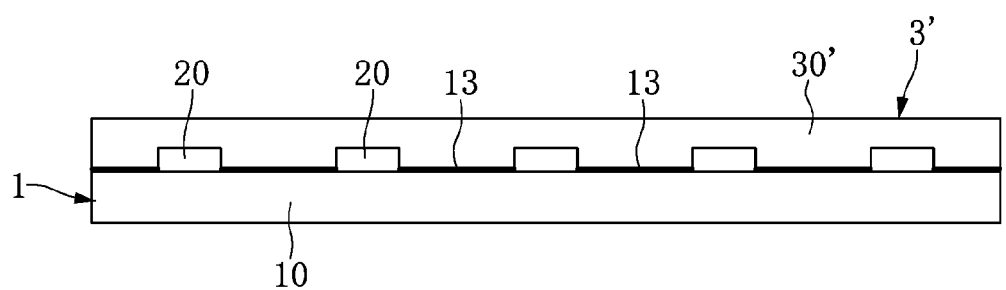
FIG. 3 shows a cross-sectional view taken along the section line A-A of FIG. 2.

Referring to FIG. 1 to FIG. 7, the first embodiment of the present disclosure provides a method of manufacturing a light-emitting array module M, comprising the following steps:

First, referring to FIG. 1 to FIG. 3, the method comprises providing a circuit substrate 1 (S100), arranging a plurality of light-emitting groups 20 in matrix arrangement on the circuit substrate 1 (S102), and then forming an initial encapsulation layer 3' on the circuit substrate 1 to encapsulate or enclose the light-emitting groups 20 (S104). More particularly, the light-emitting groups 20 are arranged on the circuit substrate 1 by a COB (Chip On Board) method. For example, the initial encapsulation layer 3' of the first embodiment of the present disclosure may be a single over-all encapsulation layer 30' formed by overall type compression molding, and the initial encapsulation layer 3' may be made of silicone or epoxy resin.

Figure 4:
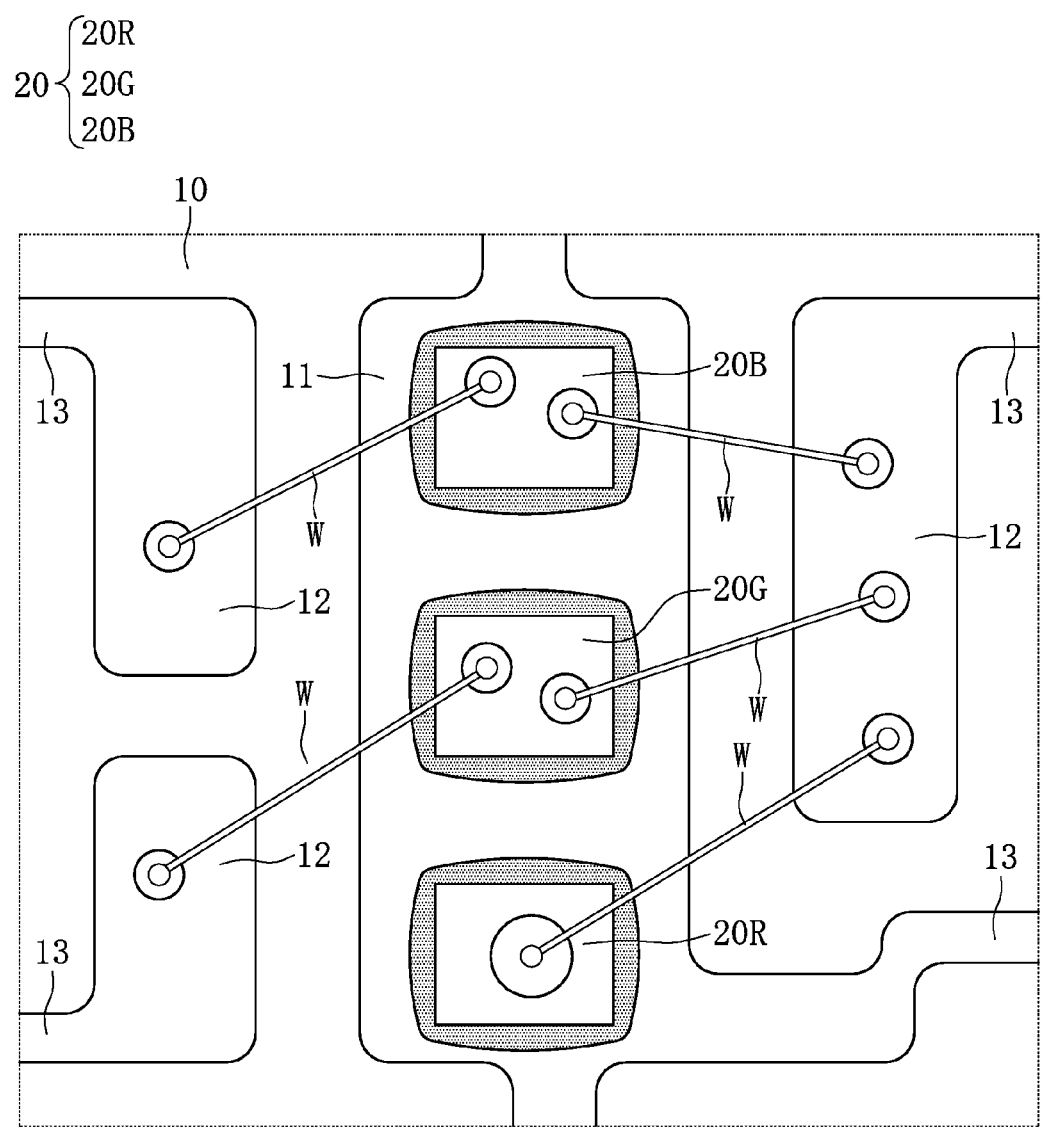
FIG. 4 shows an enlarged view of a circuit substrate and a light-emitting unit of the light-emitting array module according to the first embodiment of the present disclosure.

More particularly, referring to FIG. 3 and FIG. 4, the circuit substrate 1 includes a substrate body 10, a plurality of die bonding areas 11 disposed on the substrate body 10, a plurality of wire bonding areas 12 disposed on the substrate body 10, and a plurality of conductive circuits 13 disposed on the substrate body 10, and each light-emitting group 20 is electrically connected to the corresponding conductive circuit 13. For example, each light-emitting group 20 is composed of a red light-emitting component 20R, a green light-emitting component 20G, and a blue light-emitting component 20B. The red light-emitting component 20R, the green light-emitting component 20G and the blue light-emitting component 20B of each light-emitting group 20 are disposed on the corresponding die bonding area 11, and each of the red light-emitting component 20R, the green light-emitting component 20G, and the blue light-emitting component 20B is electrically connected to the corresponding conductive circuit 13 through two conductive wires W. It is worth noting that the red light-emitting component 20R, the green light-emitting component 20G and the blue light-emitting component 20B may be LED (Light-Emitting Diode) chips or OLED (Organic Light-Emitting Diode) chips.

Figure 5:
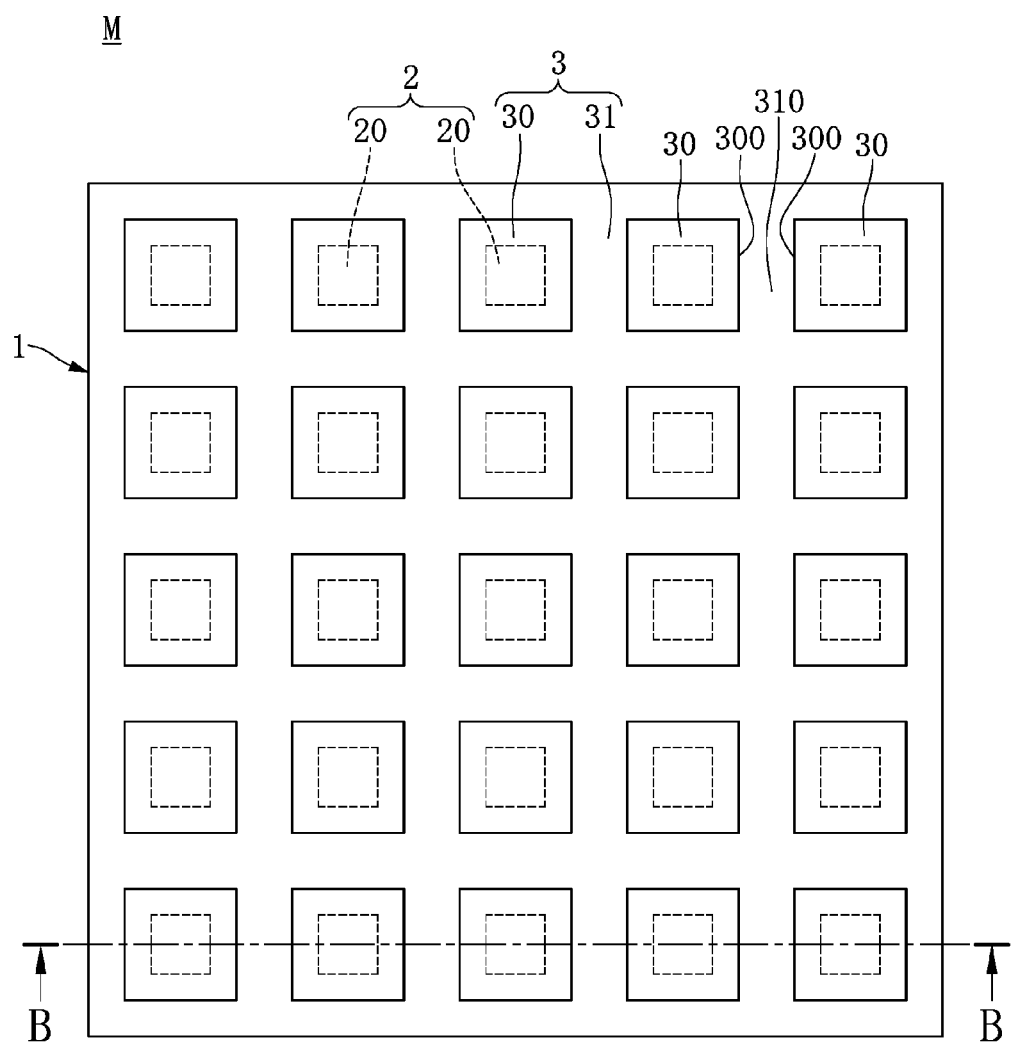
FIG. 5 shows a schematic view of a single over-all encapsulation layer of the light-emitting array module having been cut by a cutting tool according to the first embodiment of the present disclosure.
Figure 6:
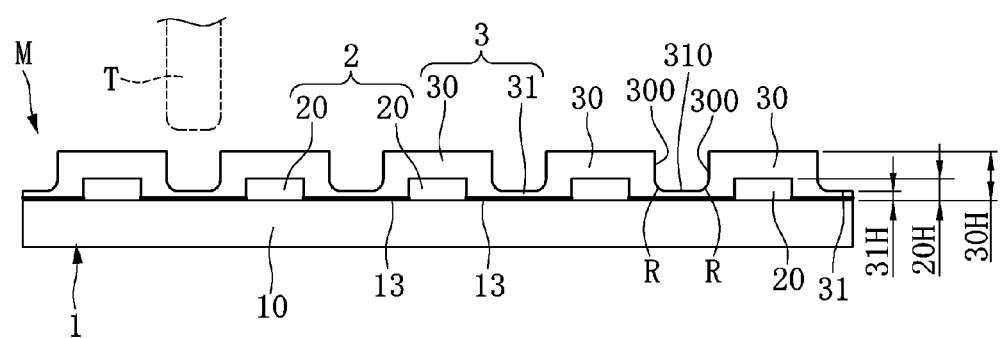
FIG. 6 shows a cross-sectional view taken along the section line B-B of FIG. 5.

Next, referring to FIG. 1, FIG. 5, and FIG. 6, the method comprises removing one part of the single over-all encapsulation layer 30' of the initial encapsulation layer 3' to form an encapsulation body 3 through a cutting tool T (S106). More particularly, the encapsulation body 3 includes a plurality of encapsulation portions 30 and a plurality of thin connection portions 31, the light-emitting groups 20 are respectively enclosed or encapsulated by the encapsulation portions 30, and each thin connection portion 31 is connected between the two adjacent encapsulation portions 30, for separating the two adjacent encapsulation portions 30 from each other by a predetermined distance. It is worth noting that the cutting tool T cannot cut across the encapsulation portions 30 to touch the circuit substrate 1, so that each of the thin connection portions 31 can be defined as a thin covering layer to cover and protect the corresponding conductive circuit 13.

More particularly, referring to FIG. 5 and FIG. 6, when the step of S106 has been finished, each encapsulation portion 30 has a surrounding cutting face 300 formed on an outer perimeter surface thereof through the cutting tool T. In addition, each thin connection portion 31 has a top cutting face 310 formed on a top side thereof through the cutting tool T, and the top cutting face 310 is connected between the two adjacent surrounding cutting faces 300 of the two adjacent encapsulation portions 30. As shown in FIG. 6, FIG. 6 shows a U-shaped cross-sectional groove formed among the two adjacent surrounding cutting faces 300 and the top cutting face 310. Therefore, light beams generated by the light-emitting group 20 are reflected inside the corresponding encapsulation portion 30 and cannot pass through the surrounding cutting faces 300 to form halation between the two adjacent encapsulation portions 30. It is worth mentioning that there is a curved chamfer R (as shown in FIG. 6) formed on a connection location between the surrounding cutting face 300 and the top cutting face 310 through the cutting tool T, and the curved chamfer R has a predetermined angle of about 3~5 degrees. In other words, all of the surrounding cutting face 300, the top cutting face 310, and the curved chamfer R are cutting faces formed by a cutting process using the cutting tool T, so that the single over-all encapsulation layer 30' of the initial encapsulation layer 3' is cut into the encapsulation portions 30 and the thin connection portions 31.

In conclusion, referring to FIG. 5 and FIG. 6, after the steps from S100 to S106, the first embodiment of the present disclosure further provides a light-emitting array module M, comprising: a circuit substrate 1, a light-emitting unit 2, and an encapsulation body (such as a package body) 3. The light-emitting unit 2 includes a plurality of light-emitting groups 20 arranged in matrix on the circuit substrate 1 and electrically connected to the circuit substrate 1, and the encapsulation body 3 is disposed on the circuit substrate 1 for encapsulating the light-emitting groups 20. More particularly, the encapsulation body 3 includes a plurality of encapsulation portions 30 and a plurality of thin connection portions 31, the light-emitting groups 20 are respectively encapsulated and enclosed by the encapsulation portions 30, and each thin connection portion 31 is connected between the two adjacent encapsulation portions 30 in order to separate the two adjacent encapsulation portions 30 from each other by a predetermined distance. Moreover, each encapsulation portion 30 has a surrounding cutting face 300 formed on an outer perimeter surface thereof, each thin connection portion 31 has a top cutting face 310 formed on a top side thereof and connected between the two adjacent surrounding cutting faces 300 of the two adjacent encapsulation portions 30, and a curved chamfer R is formed on a connection location between the surrounding cutting face 300 and the top cutting face 310.

Hence, light beams generated by the light-emitting group 20 can be transformed into an obvious single point light source without halation due to the design of "each thin connection portion 31 being connected between the two adjacent encapsulation portions 30 in order to separate the two adjacent encapsulation portions 30 from each other by a predetermined distance", so that the color resolution of the light-emitting array module M is increased. In addition, the light beams generated by the light-emitting group 20 pass through the corresponding encapsulation portion 30 to form a projection light source, and the light-emitting angle of the projection light source is increased.

As shown in FIG. 6, it is worth noting that a thickness 31H of the thin connection portion 31 relative to the circuit substrate 1 is smaller than a thickness 30H of the encapsulation portion 30 relative to the circuit substrate 1, and the thickness 31H of the thin connection portion 31 relative to the circuit substrate 1 is smaller than a thickness 20H of the light-emitting group 20 relative to the circuit substrate 1. For example, the thickness 31H of the thin connection portion 31 relative to the circuit substrate 1 is in a range between 0.1 mm and 1 mm, but that is merely an example and is not meant to limit the present disclosure.

Figure 7:
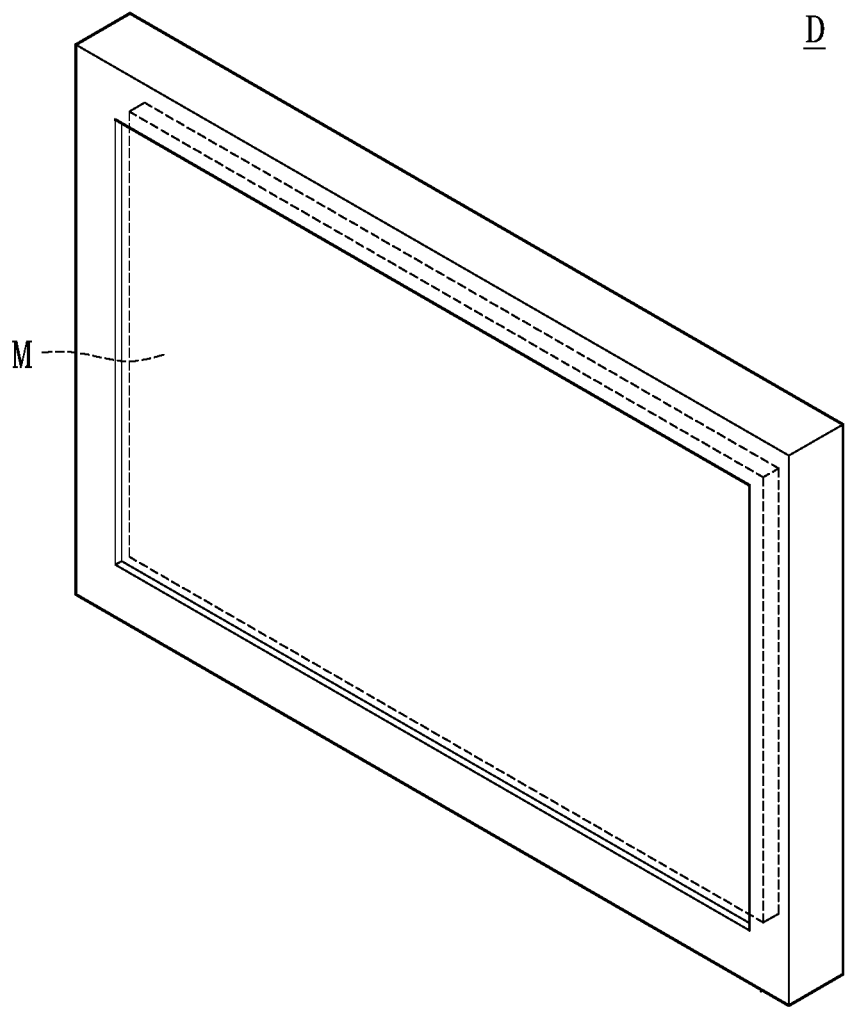
FIG. 7 shows a schematic view of the display device including a light-emitting array module according to the first embodiment of the present disclosure.

As shown in FIG. 7, it is worth mentioning that the first embodiment of the present disclosure further provides a display device D including a light-emitting array module M, and the light-emitting groups 20 are respectively defined as a plurality of pixels for the display device D. For example, the display device D may be a LED TV, a LED display, or a LED billboard. In addition, the light-emitting array module M includes a circuit substrate 1, a light-emitting unit 2, and an encapsulation body 3, the wholeness structure of the light-emitting array module M in FIG. 7 is the same as the descriptions in FIG. 5 and FIG. 6.

Figure 8:
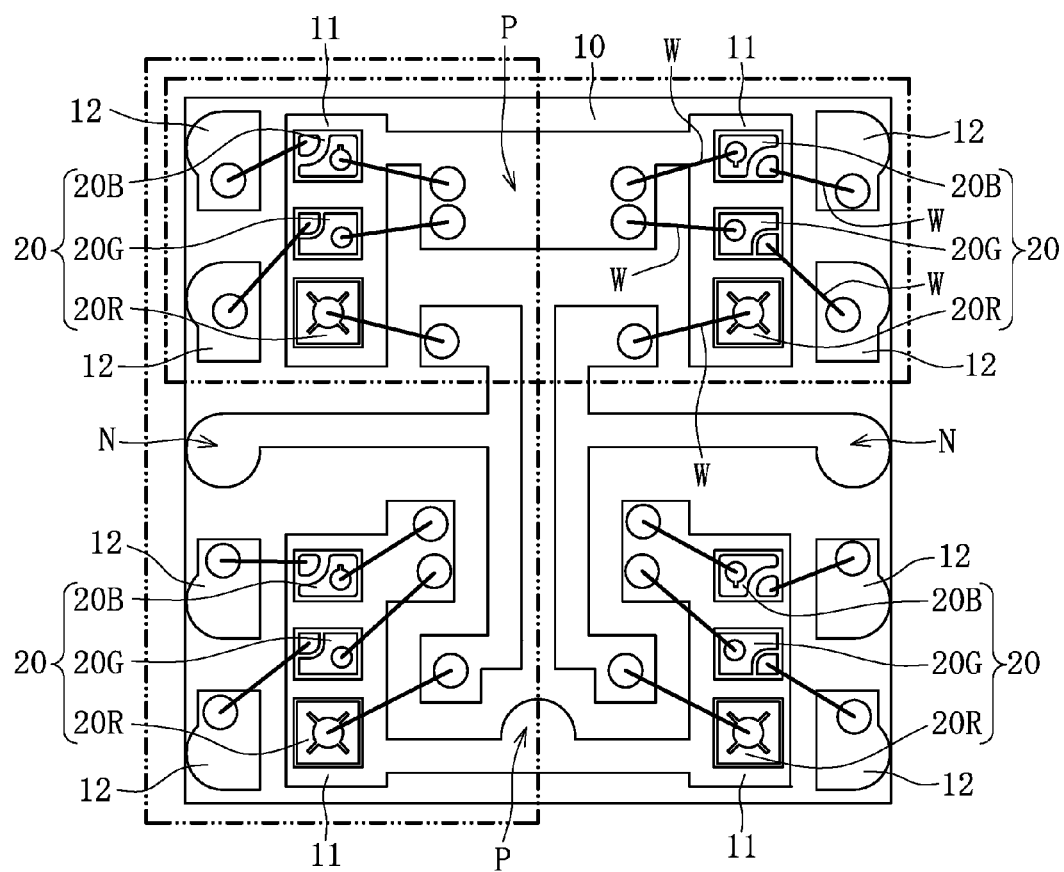
FIG. 8 shows a top, schematic view of the light-emitting array module including four light-emitting groups in matrix arrangement on the circuit substrate according to the first embodiment of the present disclosure.
Figure 9:
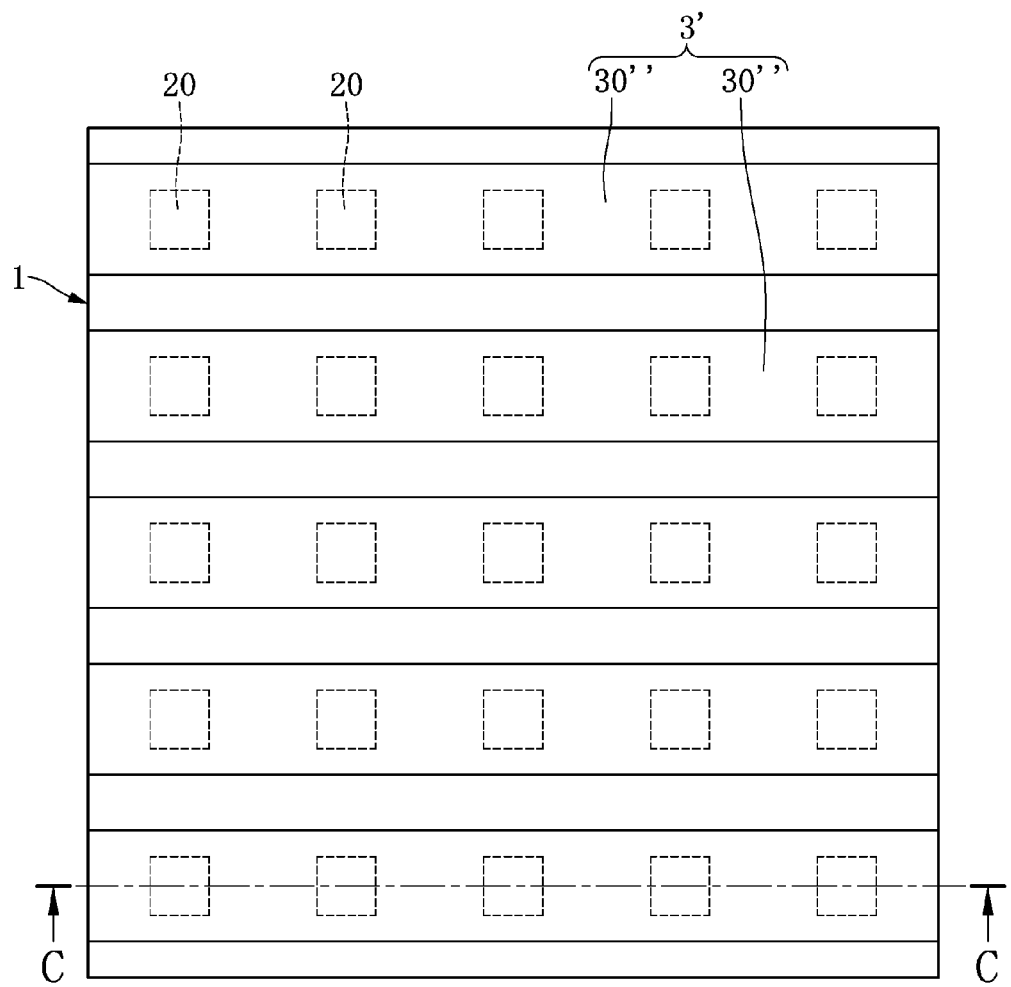
FIG. 9 shows a schematic view of a strip-shaped encapsulation layer of the light-emitting array module having not been cut by a cutting tool yet according to the second embodiment of the present disclosure.
Figure 10:
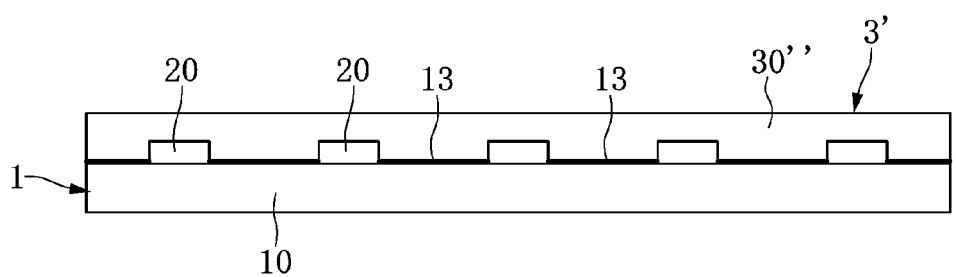
FIG. 10 shows a cross-sectional view taken along the section line C-C of FIG. 9.
Figure 11:
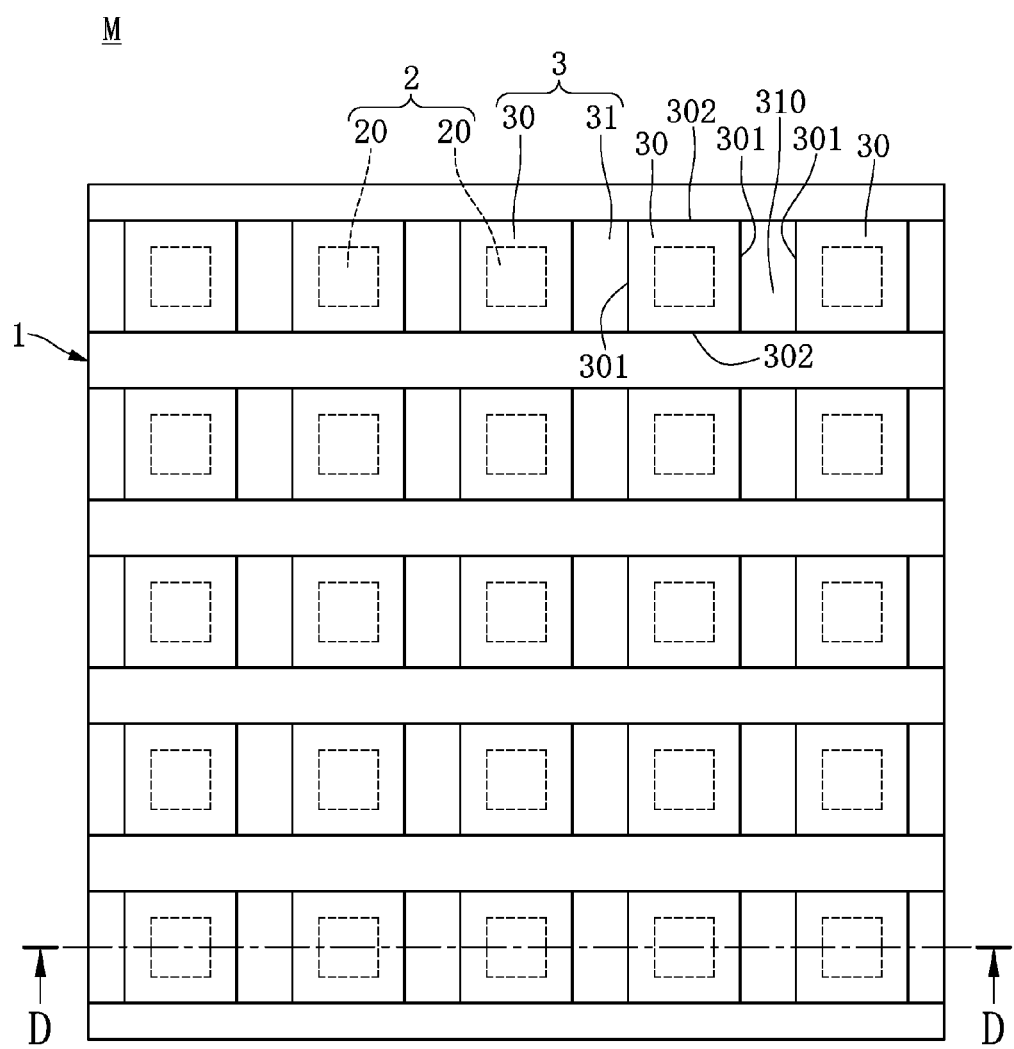
FIG. 11 shows a schematic view of a strip-shaped encapsulation layer of the light-emitting array module having been cut by a cutting tool according to the second embodiment of the present disclosure.

Referring to FIG. 8, FIG. 8 shows a top, schematic view of the light-emitting array module M including four light-emitting groups 20 in matrix arrangement on the circuit substrate 1. Each light-emitting group 20 includes a red light-emitting component 20R, a green light-emitting component 20G and a blue light-emitting component 20B. For example, the red light-emitting component 20R, the green light-emitting component 20G and the blue light-emitting component 20B may be LED chips or OLED chips according to different requirements. The red light-emitting component 20R, the green light-emitting component 20G and the blue light-emitting component 20B of each light-emitting group 20 are disposed on the same die bonding area 11. Each of the green light-emitting component 20G and the blue light-emitting component 20B is electrically connected to two different wire bonding areas 12 through two conductive wires W, and the red light-emitting component 20R is electrically connected to a wire bonding area 12 through the conductive wire W.

Following the above description, two adjacent light-emitting groups 20 can share the same common positive electrode lead P or the same common negative electrode lead N due to circuit layout as shown in FIG. 8. For example, the circuit substrate 1 has at least two common positive electrode leads P and at least two common negative electrode leads N. In addition, every two transversely adjacent light-emitting groups 20 (i.e., the right and the left light-emitting groups 20 as shown in FIG. 8) are disposed on the same common positive electrode lead P to electrically share the same common positive electrode lead P, and the two red light-emitting components 20R of every two longitudinally adjacent light-emitting groups 20 (i.e., the upper and the lower light-emitting groups 20 as shown in FIG. 8) electrically share the same common negative electrode lead N. In other words, shown as the transverse imaginary frame in FIG. 8, every two transversely adjacent light-emitting groups 20 share the same common positive electrode lead P, so that every two transversely adjacent light-emitting groups 20 can be controlled by the same control integrated circuit (IC) so as to simplify circuit layout of the circuit substrate 1. In addition, shown as the longitudinal imaginary frame in FIG. 8, the two red light-emitting components 20R of every two longitudinally adjacent light-emitting groups 20 electrically share the same common negative electrode lead N, so that the number of negative electrode pads (i.e., the number of negative pins) that are disposed on the rear of the circuit substrate 1 and electrically connected to the common negative electrode lead N is reduced.

[Second Embodiment]

Referring to FIG. 9 to FIG. 12, the second embodiment of the present disclosure provides a light-emitting array module M and a method of manufacturing the same. Comparing FIG. 9 to FIG. 12 with FIG. 2, FIG. 3, FIG. 5, and FIG. 6 respectively, the difference between the second embodiment and the first embodiment is as follows: in the second embodiment, the initial encapsulation layer 3' may be a strip-shaped encapsulation layer 30" formed by strip-shaped type compression molding, and the space between two adjacent strip-shaped encapsulation layers 30" is unoccupied.

Figure 12:
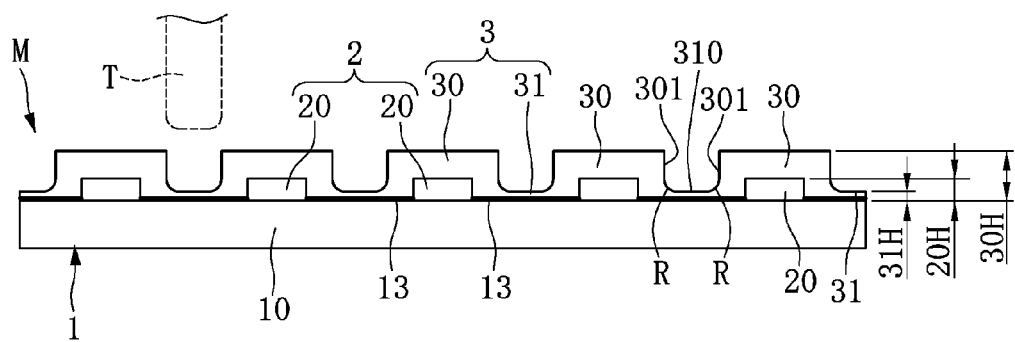
FIG. 12 shows a cross-sectional view taken along the section line D-D of FIG. 11.

Hence, each encapsulation portion 30 has two lateral cutting faces 301 and two lateral non-cutting faces 302 formed through the cutting tool T, the two lateral cutting faces 301 are opposite to each other, and the two lateral non-cutting faces 302 are opposite to each other and connected between the two lateral cutting faces 301. In addition, each thin connection portion 31 has a top cutting face 310 formed on a top side thereof through the cutting tool T and connected between the two adjacent lateral cutting faces 301 of the two adjacent encapsulation portions 30. It is worth mentioning that there is a curved chamfer R (as shown in FIG. 12) formed on a connection location between the lateral cutting face 301 and the top cutting face 310 through the cutting tool T, and the curved chamfer R has a predetermined angle of about 3~5 degrees. In other words, all of the lateral cutting face 301, the top cutting face 310, and the curved chamfer R are cutting faces formed by a cutting process using the cutting tool T, so that the strip-shaped encapsulation layers 30" of the initial encapsulation layer 3' is cut into the encapsulation portions 30 and the thin connection portions 31.

Hence, light beams generated by the light-emitting group 20 can be transformed into an obvious single point light source without halation due to the design of "each thin connection portion 31 being connected between the two adjacent encapsulation portions 30 in order to separate the two adjacent encapsulation portions 30 from each other by a predetermined distance", so that the color resolution of the light-emitting array module M is increased. In addition, the light beams generated by the light-emitting group 20 pass through the corresponding encapsulation portion 30 to form a projection light source, and the light-emitting angle of the projection light source is increased.

It is worth mentioning that the second embodiment of the present disclosure further provides a display device D including a light-emitting array module M.

In conclusion, light beams generated by the light-emitting group 20 can be transformed into an obvious single point light source without halation due to the design of "each thin connection portion 31 being connected between the two adjacent encapsulation portions 30 in order to separate the two adjacent encapsulation portions 30 from each other by a predetermined distance", so that the color resolution of the light-emitting array module M is increased. In addition, the light beams generated by the light-emitting group 20 pass through the corresponding encapsulation portion 30 to form a projection light source having a light-emitting angle that is increased due to the design of "each thin connection portion 31 being connected between the two adjacent encapsulation portions 30 in order to separate the two adjacent encapsulation portions 30 from each other by a predetermined distance".

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A light-emitting array module, comprising:
a circuit substrate;
a light-emitting unit including a plurality of light-emitting groups arranged in matrix on the circuit substrate, wherein each light-emitting group including a red light-emitting component, a green light-emitting component, and a blue light-emitting component, and the circuit substrate has a plurality of common positive electrode leads and a plurality of common negative electrode leads, and two red light-emitting components of every two longitudinally adjacent light-emitting groups are electrically connected with the same common negative electrode lead; and
an encapsulation body for encapsulating the light-emitting groups;
wherein the encapsulation body includes a plurality of encapsulation portions and a plurality of thin connection portions, the light-emitting groups are respectively enclosed by the encapsulation portions, each thin connection portion is connected between the two adjacent encapsulation portions, and a thickness of the thin connection portion relative to the circuit substrate is smaller than a thickness of the encapsulation portion relative to the circuit substrate.

2. The light-emitting array module of claim 1, wherein each encapsulation portion has a surrounding cutting face formed on an outer perimeter surface thereof.

3. The light-emitting array module of claim 2, wherein each thin connection portion has a top cutting face formed on a top side thereof and connected between the two adjacent surrounding cutting faces of the two adjacent encapsulation portions, and a curved chamfer is formed on a connection location between the surrounding cutting face and the top cutting face.

4. The light-emitting array module of claim 1, wherein each encapsulation portion has two lateral cutting faces opposite to each other and two lateral non-cutting faces opposite to each other and connected between the two lateral cutting faces.

5. The light-emitting array module of claim 4, wherein each thin connection portion has a top cutting face formed on a top side thereof and connected between the two adjacent lateral cutting faces of the two adjacent encapsulation portions, and a curved chamfer is formed between the lateral cutting face and the top cutting face.

6. The light-emitting array module of claim 1, wherein the thickness of the thin connection portion relative to the circuit substrate is smaller than a thickness of the light-emitting group relative to the circuit substrate.

7. The light-emitting array module of claim 6, wherein the thickness of the thin connection portion relative to the circuit substrate is substantially between 0.1 mm and 1 mm.

8. The light-emitting array module of claim 1, wherein the light-emitting unit includes four light-emitting groups arranged in matrix on the circuit substrate.

9. The light-emitting array module of claim 8, wherein the circuit substrate has two common positive electrode leads and two common negative electrode leads.

10. The light-emitting array module of claim 9, wherein every two transversely adjacent light-emitting groups are disposed on the same common positive electrode lead to be electrically connected with the same common positive electrode lead.

11. A display device including a light-emitting array module, wherein the light-emitting array module comprises:
a circuit substrate;
a light-emitting unit including a plurality of light-emitting groups arranged in matrix on the circuit substrate, wherein the light-emitting groups are respectively defined as a plurality of pixels for the display device, each light-emitting group including a red light-emitting component, a green light-emitting component, and a blue light-emitting component, and the circuit substrate has a plurality of common positive electrode leads and a plurality of common negative electrode leads, and two red light-emitting components of every two longitudinally adjacent light-emitting groups are electrically connected with the same common negative electrode lead; and
an encapsulation body for encapsulating the light-emitting groups;
wherein the encapsulation body includes a plurality of encapsulation portions and a plurality of thin connection portions, the light-emitting groups are respectively enclosed by the encapsulation portions, each thin connection portion is connected between the two adjacent encapsulation portions, and a thickness of the thin connection portion relative to the circuit substrate is smaller than a thickness of the encapsulation portion relative to the circuit substrate.

12. The display device of claim 11, wherein each encapsulation portion has a surrounding cutting face formed on an outer perimeter surface thereof.

13. The display device of claim 12, wherein each thin connection portion has a top cutting face formed on a top side thereof and connected between the two adjacent surrounding cutting faces of the two adjacent encapsulation portions, and a curved chamfer is formed on a connection location between the surrounding cutting face and the top cutting face.

14. The display device of claim 11, wherein each encapsulation portion has two lateral cutting faces opposite to each other and two lateral non-cutting faces opposite to each other and connected between the two lateral cutting faces.

15. The display device of claim 14, wherein each thin connection portion has a top cutting face formed on a top side thereof and connected between the two adjacent lateral cutting faces of the two adjacent encapsulation portions, and a curved chamfer is formed between the lateral cutting face and the top cutting face.

16. The display device of claim 11, wherein the thickness of the thin connection portion relative to the circuit substrate is smaller than a thickness of the light-emitting group relative to the circuit substrate.

17. The display device of claim 16, wherein the thickness of the thin connection portion relative to the circuit substrate is substantially between 0.1 mm and 1 mm.

18. The light-emitting array module of claim 11, wherein the light-emitting unit includes four light-emitting groups arranged in matrix on the circuit substrate.

19. The light-emitting array module of claim 18, wherein the circuit substrate has two common positive electrode leads and two common negative electrode leads.

\* \* \* \* \*